United States Patent
Oda

(10) Patent No.: US 10,317,452 B2
(45) Date of Patent: Jun. 11, 2019

(54) TESTING DEVICE, TESTING METHOD, AND PROGRAM FOR POWER SYSTEM PROTECTION CONTROL SYSTEM

(71) Applicant: Mitsubishi Electric Corporation, Chiyoda-ku, Tokyo (JP)

(72) Inventor: Shigetoo Oda, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 194 days.

(21) Appl. No.: 15/307,212

(22) PCT Filed: Jun. 13, 2014

(86) PCT No.: PCT/JP2014/065765
§ 371 (c)(1),
(2) Date: Oct. 27, 2016

(87) PCT Pub. No.: WO2015/189989
PCT Pub. Date: Dec. 17, 2015

(65) Prior Publication Data
US 2017/0045570 A1 Feb. 16, 2017

(51) Int. Cl.
*G01R 31/02* (2006.01)
*H02H 7/04* (2006.01)
(Continued)

(52) U.S. Cl.
CPC ....... *G01R 31/027* (2013.01); *G01R 19/2513* (2013.01); *G01R 35/00* (2013.01);
(Continued)

(58) Field of Classification Search
CPC .. G01R 19/2513; G01R 31/027; G01R 35/00; H02H 7/04; H02H 7/042
(Continued)

(56) References Cited

U.S. PATENT DOCUMENTS 6,496,342 B1 * 12/2002 Horvath ................. H02H 7/261
361/62
2006/0123368 A1 * 6/2006 Pineda De Gyvez ......................
G06F 1/3203
716/133

(Continued)

FOREIGN PATENT DOCUMENTS

JP 2001-268791 A 9/2001
JP 2011-155779 A 8/2011
(Continued)

OTHER PUBLICATIONS

Extended European Search Report dated Jan. 4, 2018, issued by the European Patent Office in corresponding European Application No. 148943343. (10 pages).
(Continued)

*Primary Examiner* — John E Breene
*Assistant Examiner* — Jeffrey P Aiello
(74) *Attorney, Agent, or Firm* — Buchanan Ingersoll & Rooney PC

(57) ABSTRACT

A testing device tests an intelligent electronic device of a power system. A PC generates failure data by performing: simulation calculation for a CT and a PT with respect to current waveform data of a current transformer and voltage waveform data of a potential transformer based on a characteristic of an instrument transformer; and simulation calculation for an MU with respect to the current waveform data of the current transformer and the voltage waveform data of the potential transformer based on a characteristic of the MU. The testing device acquires device information data indicating a circuit breaker of the power system, in synchronization with the failure data. The testing device transmits the failure data and the device information data to the intelligent electronic device via a process bus in accordance (Continued)

with a setting of outputting data to the process bus and a setting of sampling.

12 Claims, 9 Drawing Sheets

(51) Int. Cl.
  *H02H 3/05* (2006.01)
  *G01R 35/00* (2006.01)
  *G01R 19/25* (2006.01)
(52) U.S. Cl.
  CPC ............... *H02H 3/05* (2013.01); *H02H 7/04* (2013.01); *H02H 7/042* (2013.01)
(58) Field of Classification Search
  USPC ....... 324/127; 340/870.04; 700/295; 702/57, 702/60, 6, 64
  See application file for complete search history.

(56) References Cited

U.S. PATENT DOCUMENTS

| | | | | |
|---|---|---|---|---|
| 2006/0139970 A1* | 6/2006 | Cheng | ................ | H02M 3/3372 363/24 |
| 2010/0169030 A1* | 7/2010 | Parlos | ...................... | G01H 1/00 702/58 |
| 2011/0196627 A1* | 8/2011 | Steinhauser | ............ | H04L 43/08 702/58 |
| 2014/0136002 A1* | 5/2014 | Gopalakrishnan | ....... | H04Q 9/00 700/286 |
| 2015/0316593 A1* | 11/2015 | Oda | ................... | G01R 19/2513 702/60 |

FOREIGN PATENT DOCUMENTS

| | | |
|---|---|---|
| JP | 2012-080600 A | 4/2012 |
| JP | 2012-249387 A | 12/2012 |
| JP | 2014-55800 A | 3/2014 |

OTHER PUBLICATIONS

Apostolov et al., "Testing of distributed IEC 61850 based protection schemes", 8th International Conference on Advances in Power System Control, Operation and Management (APSCOM 2009), Jan. 1, 2009, XP055431487, p. 212.(6 total pages).

International Search Report (PCT/ISA/210) dated Aug. 26, 2014, by the Japanese Patent Office as the International Searching Authority for International Application No. PCT/JP2014/065765.

* cited by examiner

TESTING DEVICE, TESTING METHOD, AND PROGRAM FOR POWER SYSTEM PROTECTION CONTROL SYSTEM

TECHNICAL FIELD

The present invention relates to a testing device for testing an intelligent electronic device, which is configured to (i) acquire at least information of current or voltage from a power system, (ii) detect failure in the power system, a power facility, or the like, and (iii) separate the failure from the power system.

BACKGROUND ART

In order to stabilize service of a power system, various types of devices have been utilized to detect occurrence of outages or malfunctions in the power system. For example, an intelligent electronic device (IED) is configured to (i) acquire results of measurement of voltage value and current value in the power system from a current transformer (CT), a potential transformer (PT) (or voltage transformer (VT)), and the like, (ii) detect occurrence of overvoltage, shortage of voltage, overcurrent, or the like due to failure or the like, and (iii) send a control signal to a circuit breaker. Accordingly, a countermeasure can be immediately taken by, for example, separating the failed section from the power system.

Since such an intelligent electronic device requires high reliability, the intelligent electronic device is subjected to various performance check tests in various aspects, for example, before shipment or during service.

Japanese Patent Laying-Open No. 2011-155779 (Patent Document 1) describes a digital protective power relay device having a testing function. In this digital protective power relay device, a digital relay is provided with a memory in which data of voltage waveform or current waveform corresponding to power system failure and input conditions such as device conditions in the power system side are written beforehand. This digital protective power relay device is provided with a switch, which is externally switchable to read out either (i) an amount of analog input acquired from the power system side or (ii) the waveform data written in the memory. The relay device is verified by: switching the switch to the side of the memory having the waveform data written therein; sequentially reading out the waveform data from the memory at a sampling cycle of the protective relay; and performing calculation for the relay in accordance with the data thus read out. Accordingly, a similar effect is obtained as with the case of externally applying current and voltage waveforms for simulating power system failure by utilizing a simulation power transmission line.

Japanese Patent Laying-Open No. 2012-249387 (Patent Document 2) describes the following technique: in a power system protection control system employing a process bus, for the purpose of a test, a testing device is connected to the process bus, and the testing device outputs, to an intelligent electronic device via the process bus, test electric quantity information having a test flag added therein. Based on the test electric quantity information received from the testing device, the intelligent electronic device determines whether to trip a circuit breaker. If it is determined to trip, the intelligent electronic device outputs to the process bus a test trip command having the test flag added therein. When a merging unit (MU) receives the test trip command via the process bus, the merging unit determines that the operation of the intelligent electronic device outputting the trip command is normal.

CITATION LIST

Patent Document

PTD 1: Japanese Patent Laying-Open No. 2011-155779
PTD 2: Japanese Patent Laying-Open No. 2012-249387

SUMMARY OF INVENTION

Technical Problem

According to the technique described in Patent Document 1, however, the data of the prepared memory, which has the voltage waveform data and current waveform data corresponding to the power system failure and the information of the devices in the power system, is used for the test, so that the intelligent electronic device includes hardware necessary for the test but unnecessary for normal service. Accordingly, the intelligent electronic device becomes expensive, and percent defective may become high due to the inclusion of the hardware unnecessary for normal service, disadvantageously.

On the other hand, the technique described in Patent Document 2 is directed to checking whether or not the intelligent electronic device in service is normal. Therefore, the technique described in Patent Document 2 is not sufficient to comprehensively check performance before starting service by, for example, determining whether or not the intelligent electronic device is applicable to the power system, or determining whether to connect the MU and the intelligent electronic device when combining the MU and the intelligent electronic device in the power system protection control system. In recent years, an intelligent electronic device and an MU may be provided by different manufacturers, so that it is important to comprehensively check performance by connecting the intelligent electronic device and the MU before starting service. Further, in an ongoing process of standardization for filter characteristics and dynamic ranges (DR) of MUs and for control of transmission of data in response to time synchronization signals in power system protection control systems, it is more important to check for connection with an MU and an intelligent electronic device before starting service.

Moreover, various devices are used for instrument transformers. Examples of the instrument transformers may include: an iron-core CT; an ECT (Electric CT) employing an air-core CT (Rogowski CT); and a CVT (Capacitance VT) employing a capacitor to divide voltage into small voltage. Therefore, characteristics of CTs and PTs, such as frequency characteristic and transient characteristic, may greatly differ among the CTs and PTs.

Hence, power system protection control systems need to be tested in view of the characteristics of these CTs, PTs, and MUs. In light of the problems described above, an object of the present disclosure is to provide a testing device capable of simulating comprehensive check in advance with regard to performance attained when installing an intelligent electronic device in a power system.

Solution to Problem

A testing device according to one embodiment is for testing an intelligent electronic device of a power system.

The testing device acquires failure data resulting from simulation calculation for a CT and a PT and simulation calculation for an MU, the simulation calculation for the CT and the PT being performed with respect to current waveform data and voltage waveform data in the power system based on a characteristic of an instrument transformer, the simulation calculation for the MU being performed with respect to the current waveform data and voltage waveform data in the power system based on a characteristic of the MU. The testing device acquires device information data in synchronization with the failure data, the device information data indicating a circuit breaker of the power system. The testing device transmits the failure data and device information data to the intelligent electronic device via the process bus in accordance with a setting of outputting data to the process bus and a setting of sampling.

Advantageous Effects of Invention

According to the testing device in accordance with the one embodiment described above, comprehensive performance check can be simulated in advance before applying the intelligent electronic device and the MU to protection control of the power system because the failure data, which results from (i) the simulation calculation for the CT and the PT based on the characteristics of the instrument transformers and (ii) the simulation calculation for the MU according to the characteristic of the MU, is transmitted to the intelligent electronic device in synchronization with the device data. This reduces a possibility of occurrence of a problem due to connection with the MU and the intelligent electronic device after starting service.

The foregoing and other objects, features, aspects and advantages of the present invention will become more apparent from the following detailed description of the present invention when taken in conjunction with the accompanying drawings.

DESCRIPTION OF EMBODIMENTS

Figure 1:
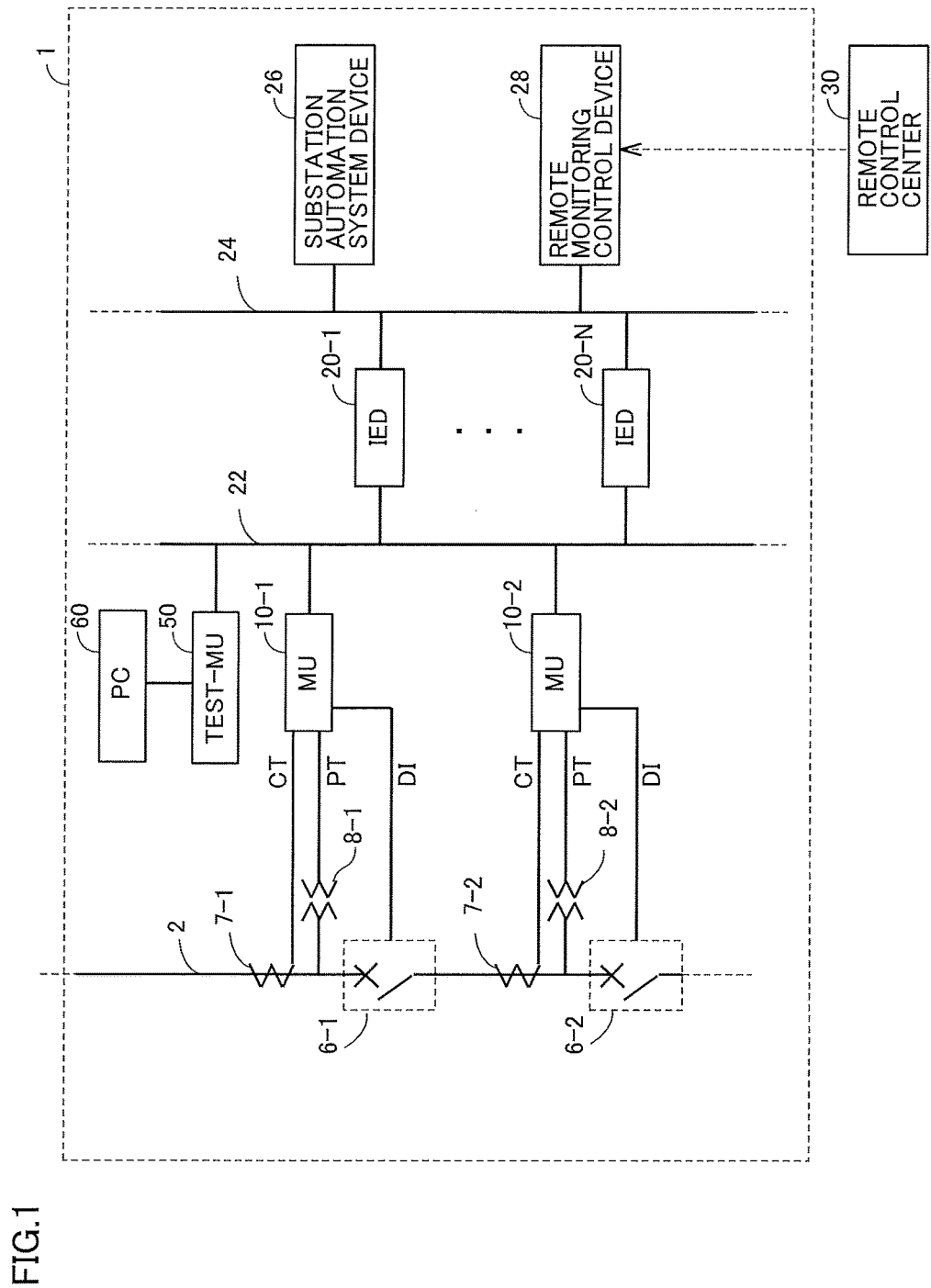
FIG. 1 shows an entire configuration of a protection control system 1 including a testing device in accordance with the present embodiment.

The following describes embodiments of the present invention with reference to figures. In the description below, the same reference characters are given to the same components. Their names and functions are also the same. Hence, they are not described in detail repeatedly.

<Entire System Configuration in First Embodiment>

First, the following describes an entire configuration of a protection control system including a testing device (TEST-MU (Merging Unit)) in accordance with a first embodiment.

FIG. 1 shows an entire configuration of a protection control system 1 including a testing device in accordance with the present embodiment. With reference to FIG. 1, protection control system 1 is provided in a substation, a power distribution station, or the like to collect information of the power system and to perform processes such as protection, control, and monitoring of the power system based on the collected information.

More specifically, protection control system 1 includes: a plurality of merging units 10-1, 10-2 (hereinafter, also collectively referred to as "merging unit 10") each configured to collect information, such as current and voltage, from the power system; and a plurality of intelligent electronic devices 20-1 to 20-N (hereinafter, also abbreviated as "IED" and also collectively referred to as "intelligent electronic device 20") configured to protect, control, and monitor the power system. Data communication can be made between merging units 10-1 to 10-5 and intelligent electronic devices 20-1 to 20-N via a process bus 22. Generally, in protection control system 1, the plurality of intelligent electronic devices 20 are disposed based on purposes of use (for example, based on targets of protection or based on targets of control). Examples of the IEDs thus disposed based on the purposes of use include: a protective IED configured to implement a protective function; and a control IED configured to implement a control function.

Each merging unit 10 sends (i) the information collected from the power system to (ii) an intelligent electronic device 20 corresponding to that merging unit 10. Based on the information received from corresponding merging unit 10, each of intelligent electronic devices 20 performs a process such as protection, control, or monitoring of the power system.

More specifically, by way of an example of the protective function, intelligent electronic device 20 determines, at a predetermined cycle, whether or not a relay calculation logic set in advance is established, and outputs a trip signal to a corresponding circuit breaker when the relay calculation logic is established. This trip signal may be transmitted via process bus 22.

On the other hand, by way of an example of the control function, intelligent electronic device 20 can output a command to close/open a switch in the power system, for example. Further, by way of an example of the monitoring function, if some power system failure occurs, intelligent electronic device 20 can log information of the power system before and after the occurrence of the power system failure, and can output the state of the power system in real time. For example, intelligent electronic device 20 is connected to a substation automation system (SAS) device 26 and a remote monitoring control device 28 via a station bus 24. Also, intelligent electronic device 20 can output the information of the power system to substation automation system device 26, and also can output the information of the power system to a remote control center 30, which is distant away from the power facility of interest, via remote monitoring control device 28. Furthermore, intelligent electronic device 20 can be configured to implement intended processes other than the processes described above. For example, intelligent electronic device 20 may be utilized to implement a function equivalent to substation automation system device 26.

In a power transmission line 2, a circuit breaker 6-1, a current transformer (CT) 7-1, and a potential transformer (PT) (/voltage transformer (VT)) 8-1 are provided. Current transformer 7-1 measures information (current waveform) of current flowing through power transmission line 2. Potential transformer 8-1 measures information (voltage waveform) of voltage generated in power transmission line 2. Although not shown for ease of description, in the case of three-phase alternating current, a current transformer and a potential transformer are provided for each of the three phases. The respective pieces of information measured by current transformer 7-1 and potential transformer 8-1 are sent to merging unit 10-1. In other words, merging unit 10-1 collects (i) the information of the current flowing through power transmission line 2 and (ii) the information of the voltage generated in power transmission line 2.

Likewise, in a supply line 4, a circuit breaker 6-2, a current transformer 7-2, and a potential transformer 8-2 are provided. Respective pieces of information measured by current transformer 7-2 and potential transformer 8-2 are sent to merging unit 10-2. It should be noted that the current transformers may be also collectively referred to as "current transformer 7". Moreover, the potential transformers may be also collectively referred to as "potential transformer 8". Moreover, the circuit breakers may be also collectively referred to as "circuit breaker 6".

Merging unit 10-1 receives device information (DI) of circuit breaker 6-1. Likewise, merging unit 10-2 receives device information (DI) of circuit breaker 6-2. Each merging unit 10 converts the received data into digital data. Merging unit 10, which is configured to receive a time synchronization signal from outside, performs synchronization control for sampling or the like in accordance with the time synchronization signal and outputs digital data to process bus 22 as serial data. The serial data thus output to process bus 22 is received by intelligent electronic device 20 connected to process bus 22. Intelligent electronic device 20 uses the received serial data to perform protection control calculation in order to determine whether or not the power system is failed. If it is determined that the power system is failed, intelligent electronic device 20 outputs a trip command to a circuit breaker associated with the failure, thereby separating the failure point from the power system.

A testing device (TEST-MU) 50 of the first embodiment is connected to process bus 22. Moreover, testing device 50 is connected to a PC (Personal Computer) 60, which is a general-purpose information processing device, via a general-purpose input/output IF (interface), for example.

<Overview of Merging Unit>

Next, the following describes overview of merging unit 10 in accordance with the present embodiment.

Figure 2:
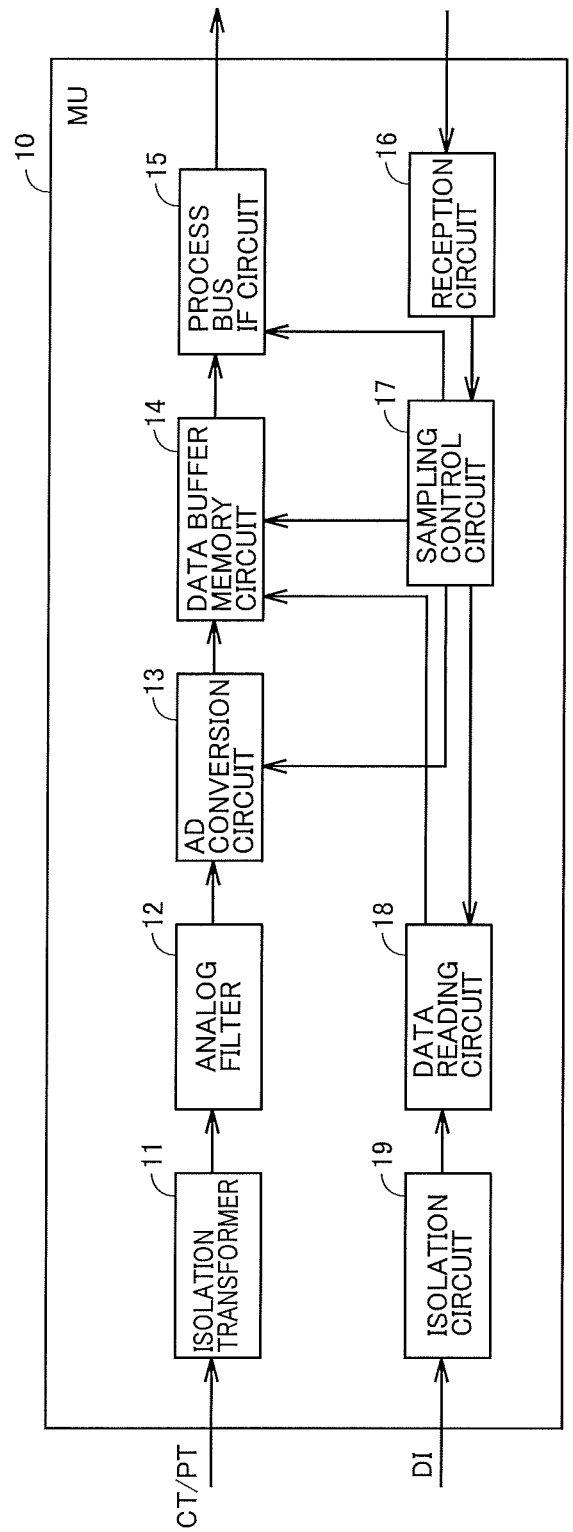
FIG. 2 shows a functional configuration of a merging unit 10.

FIG. 2 shows a functional configuration of merging unit 10. With reference to FIG. 2, a measured value (analog signal) from an instrument transformer (CT, PT) provided in the power transmission line, the bus, or the like is sent to merging unit 10. Merging unit 10 collects current information and/or voltage information of the power system, and outputs digital data indicating the collected information to intelligent electronic device 20. In other words, pieces of information necessary for protection, control, monitoring, and the like of the power system are collected in merging unit 10. Examples of this digital data typically include serial data in which measured values are arranged in series in the order of sampling times. Merging unit 10 receives current waveform signal and/or voltage waveform signal of the power system, digitally converts the current waveform signal and/or voltage waveform signal, and then outputs the digitally converted current waveform signal and/or voltage waveform signal via process bus 22 as serial data.

Merging unit 10 includes an isolation transformer 11, an analog filter 12, an AD (Analog to Digital) conversion circuit 13, a data buffer memory circuit 14, a process bus IF circuit 15, a reception circuit 16, a sampling control circuit 17, a data reading circuit 18, and an isolation circuit 19. Isolation transformer 11 receives at least one of (i) a current waveform measured by current transformer 7 and (ii) a voltage waveform measured by potential transformer 8. The data received from current transformer 7 or potential transformer 8 is isolated by isolation transformer 11, and is converted by an internal circuit of merging unit 10 to have an appropriate voltage signal level.

Analog filter 12 removes a high-frequency noise component superimposed on the received current waveform or voltage waveform.

AD conversion circuit 13 converts the analog input signal into digital data in accordance with a sampling control signal from sampling control circuit 17, and data buffer memory circuit 14 holds the converted digital data therein.

Isolation circuit 19 receives device information (DI) indicating circuit breaker 6 or the like, and converts the received signal into a signal having a certain voltage.

Data reading circuit 18 holds the signal converted by isolation circuit 19 and reads the device information (DI) in accordance with the sampling control signal from sampling control circuit 17, and then data buffer memory circuit 14 holds the device information (DI).

Reception circuit 16 receives a time synchronization signal from an external system (for example, GPS (Global Positioning System)) and outputs it to sampling control circuit 17.

Sampling control circuit 17 receives the time synchronization signal from reception circuit 16, and outputs a sampling control signal indicating a timing of sampling to AD conversion circuit 13, data buffer memory circuit 14, process bus IF circuit 15, and data reading circuit 18.

Data buffer memory circuit 14 holds (i) the digitally converted data of the received current waveform or voltage waveform, and (ii) the device information to be synchronized with this data. In accordance with the sampling control signal from sampling control circuit 17, data buffer memory circuit 14 converts the held data into data compliant with a protocol defined in process bus 22, and outputs the resulting data to process bus 22 via process bus IF circuit 15.

Process bus IF circuit 15 is an interface configured to sequentially output data to process bus 22 as serial data.

<Overview of PC 60>

Figure 3:
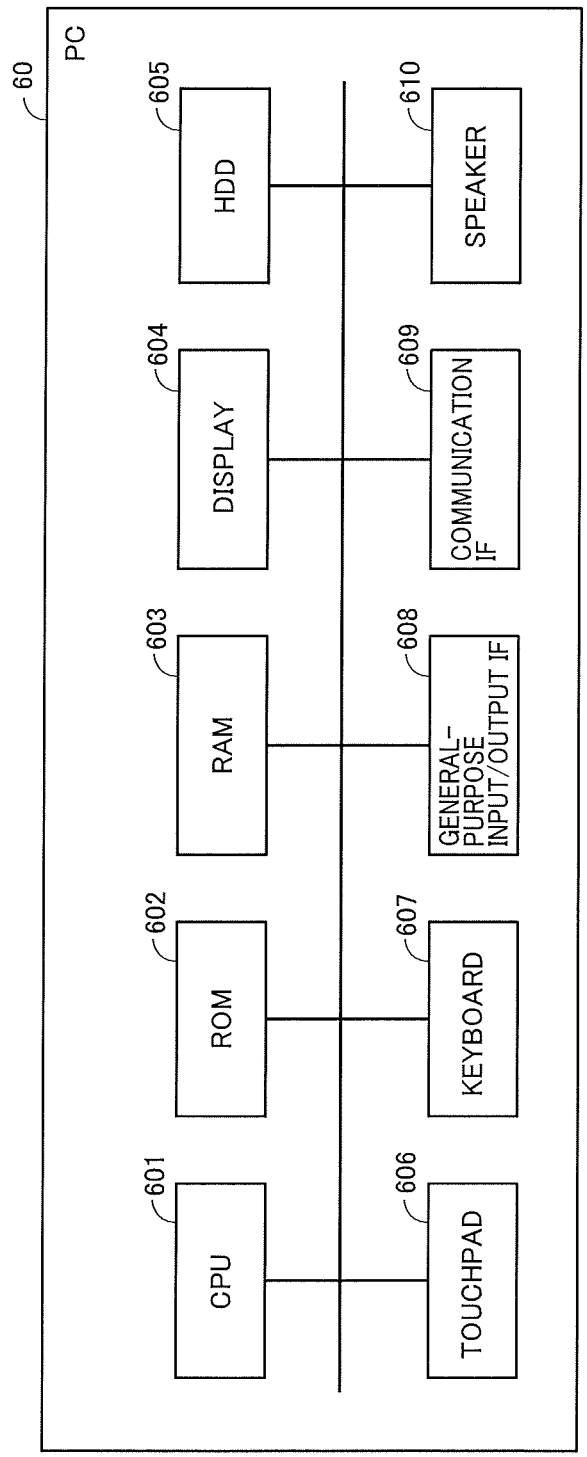
FIG. 3 is a block diagram showing a configuration of a PC 60.

With reference to FIG. 3, the following describes a configuration of PC 60 connected to testing device 50.

FIG. 3 is a block diagram showing a configuration of PC 60. PC 60 includes a CPU (Central Processing Unit) 601, a ROM (Read Only Memory) 602, a RAM (Random Access Memory) 603, a display 604, a microphone 605, a touchpad 606, a keyboard 607, a general-purpose input/output IF 608, a communication IF 609, and a speaker 610.

CPU 601 executes various types of programs including an OS (Operating System) to control operation of PC 60. ROM 602 stores BIOS (Basic Input/Output System) and various types of data. RAM 603 provides a work area for storing data necessary for CPU 601 to execute a program. Display

604 displays various types of information. HDD (Hard Disk Drive) 605 stores a program or the like in a non-volatile manner.

Touchpad 606, which is an operation member configured to receive a user's input operation, receives the user's touch as an input operation by detecting the user's touch by way of a capacitive method, for example. Keyboard 607, which is an operating member configured to receive the user's input operation, receives a key input from the user. General-purpose input/output IF 608, which is a general-purpose input/output interface such as a USB (Universal Serial Bus), serves as an interface configured to provide connection to an external device. Communication IF 609 is an interface for communication in compliance with a LAN (Local Area Network) standard or the like. Speaker 610 outputs sound in accordance with control of CPU 601.

<Overview of Testing Device 50>

Figure 4:
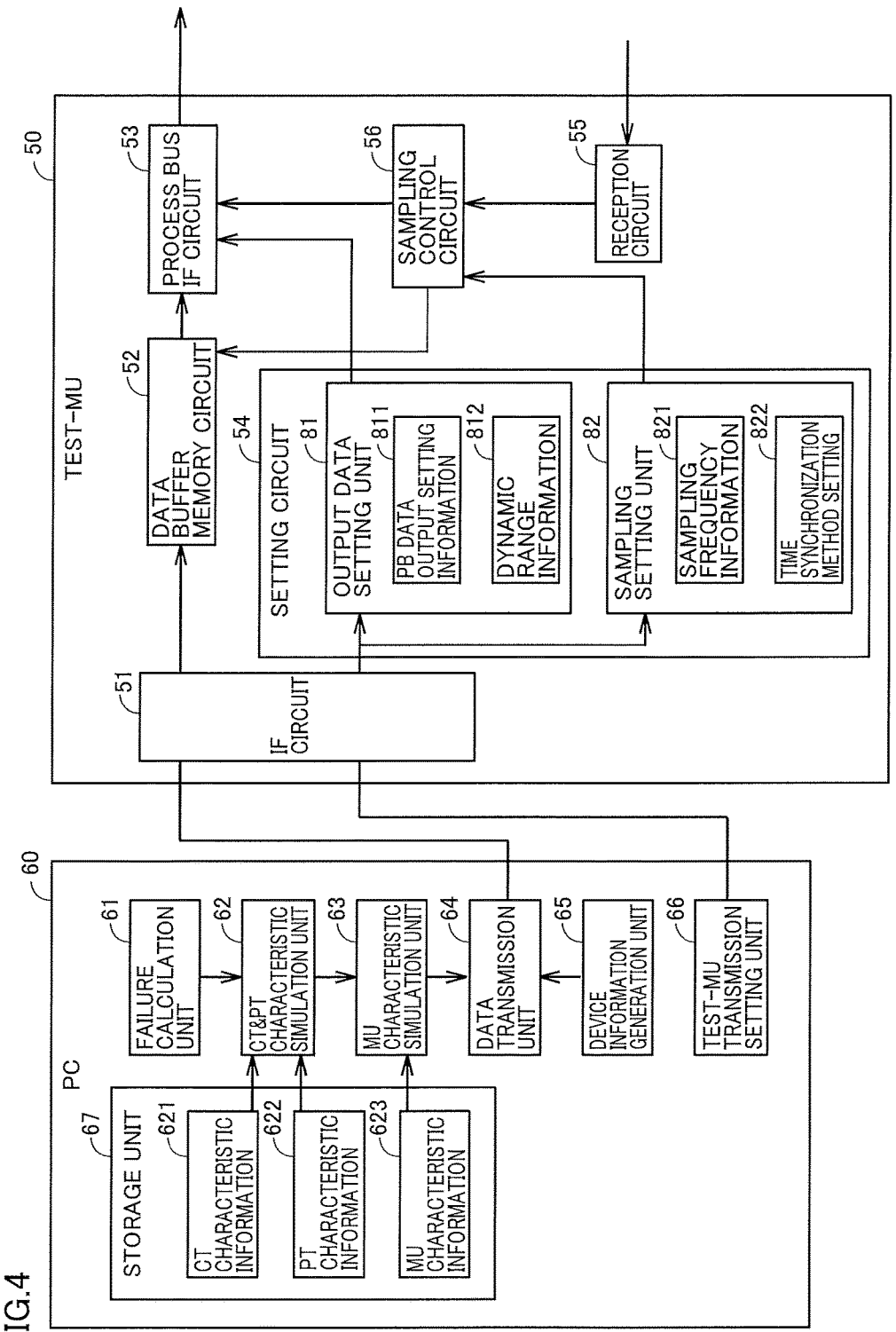
FIG. 4 shows a configuration of testing device 50 and a functional configuration of PC 60.

With reference to FIG. 4, the following describes a configuration of testing device 50 and a functional configuration of PC 60.

FIG. 4 shows the configuration of testing device 50 and the functional configuration of PC 60. PC 60 includes a failure calculation unit 61, a CT&PT characteristic simulation unit 62, an MU characteristic simulation unit 63, a data transmission unit 64, a device information generation unit 65, a TEST-MU transmission setting unit 66, and a storage unit 67. Storage unit 67 stores: (i) CT characteristic information 621 indicating characteristic(s) of a CT, such as a type of the CT, a frequency characteristic of the CT, and/or a transient characteristic of the CT; (ii) PT characteristic information 622 indicating characteristic(s) of a PT, such as a type of the PT and/or a transient characteristic of the PT; and (iii) MU characteristic information 623 indicating characteristic(s) of an MU, such as a filter characteristic of the MU and/or a dynamic range of the MU.

Failure calculation unit 61 performs calculation with respect to current waveform data and voltage waveform data obtained from the CT and the PT in the power system. For example, failure calculation unit 61 is configured to beforehand hold current waveform data and voltage waveform data corresponding to failure in the power system, or is configured to receive such current waveform data and voltage waveform data corresponding to failure in the power system.

CT&PT characteristic simulation unit 62 performs simulation calculation to simulate the characteristics of the CT and the PT in accordance with (i) the characteristic of the CT indicated by CT characteristic information 621 and (ii) the characteristic of the PT indicated by PT characteristic information 622.

MU characteristic simulation unit 63 performs simulation calculation to simulate the characteristic of the MU such as the filter characteristic of the MU in accordance with the characteristic of the MU indicated by MU characteristic information 623. Through the processes by CT&PT characteristic simulation unit 62 and MU characteristic simulation unit 63, PC 60 generates, as failure data, data corresponding to a period of time necessary to verify failure in the power system (for example, data corresponding to a period of time of about several hundred milliseconds to several seconds).

Data transmission unit 64 transmits, to testing device 50, the failure data obtained by MU characteristic simulation unit 63, and an IF circuit 51 of testing device 50 receives the failure data, which is then stored into a data buffer circuit 52 of testing device 50. In PC 60, device information generation unit 65 generates, in synchronization with the failure data, device information (DI) indicating circuit breaker 6 (specifically, to change circuit breaker 6 from the close state to the open state after passage of certain time from power system failure, for example), and data transmission unit 64 transmits the generated device information (DI), which is then stored into data buffer circuit 52 together with the failure data.

TEST-MU transmission setting unit 66 holds transmission setting information (TEST-MU transmission setting information) for causing testing device 50 to output data to process bus 22. This transmission setting information is then stored into a setting circuit 54 of testing device 50 via IF circuit 51. Examples of the transmission setting information include: (i) PB data output setting information 811, which is information indicating a setting value of current or voltage value per bit for testing device 50 to output serial data to process bus 22; and (ii) dynamic range information 812 indicating a dynamic range of the current or voltage for testing device 50 to output data through a process bus IF circuit 53. Another example of the transmission setting information is a setting about sampling for testing device 50 to output serial data to process bus 22, such as: sampling frequency information 821 indicating a frequency of sampling; or a time synchronization method setting 822 indicating a setting of a time synchronization method in accordance with the time synchronization information received by testing device 50 from the outside.

Testing device 50 includes IF circuit 51, data buffer circuit 52, process bus IF circuit 53, setting circuit 54, a reception circuit 55, and a sampling control circuit 56.

IF circuit 51 exhibits a function as an interface for providing connection with PC 60.

Data buffer circuit 52 receives the failure data and the device information from PC 60 and holds them, and outputs them to process bus 22 via process bus IF circuit 53 in accordance with information of a sampling cycle provided from sampling control circuit 56.

Process bus IF circuit 53 outputs the data held by data buffer circuit 52 to process bus 22 as serial data in accordance with (i) the information of the sampling cycle provided from sampling control circuit 56, (ii) the current and voltage values per bit of the output data set by setting circuit 54, or the like.

Setting circuit 54 is a circuit configured to receive various types of data from PC 60 and hold them therein, and set a method of outputting the data from testing device 50. Setting circuit 54 includes an output data setting unit 81 and a sampling setting unit 82. Output data setting unit 81 receives information such as PB data output setting information 811 and dynamic range information 812 from PC 60, and sets process bus IF circuit 53 in accordance with settings indicated in these pieces of information so as to cause process bus IF circuit 53 to output the serial data. From PC 60, sampling setting unit 82 receives information such as sampling frequency information 821 and time synchronization method setting 822, and sets sampling control circuit 56 in accordance with settings of the sampling indicated in these pieces of information so as to cause process bus IF circuit 53 to output serial data.

Reception circuit 55 receives a time synchronization signal from outside, and outputs the received time synchronization signal to sampling control circuit 56.

Sampling control circuit 56 outputs a sampling control signal to process bus IF circuit 53 and data buffer circuit 52 based on (i) the setting of the sampling set by sampling setting unit 82 and (ii) the time synchronization signal received from reception circuit 55, thereby controlling the output of the serial data to process bus 22 by testing device 50.

Testing device 50 is configured to acquire the failure data resulting from the simulation calculation for the CT and the PT and the simulation calculation for the MU, the simulation calculation for the CT and the PT being performed with respect to the current waveform data and voltage waveform data in the power system based on the characteristic information (CT characteristic information 621 and PT characteristic information 622) indicating the characteristic of the instrument transformer, the simulation calculation for the MU being performed with respect to the current waveform data and voltage waveform data in the power system based on the characteristic information (MU characteristic information 623) indicating the characteristic of the MU. This configuration is implemented by IF circuit 51 and data buffer memory circuit 52. Moreover, testing device 50 is configured to acquire the device information data (DI) indicating the circuit breaker of the power system, in synchronization with the failure data. This configuration is implemented by IF circuit 51 and setting circuit 54. Testing device 50 is configured to transmit the failure data and the device information data (DI) to intelligent electronic device 20 via process bus 22. This configuration is implemented by setting circuit 54, data buffer memory circuit 52, process bus IF circuit 53, and sampling control circuit 56.

<Operation in First Embodiment>

Figure 5:
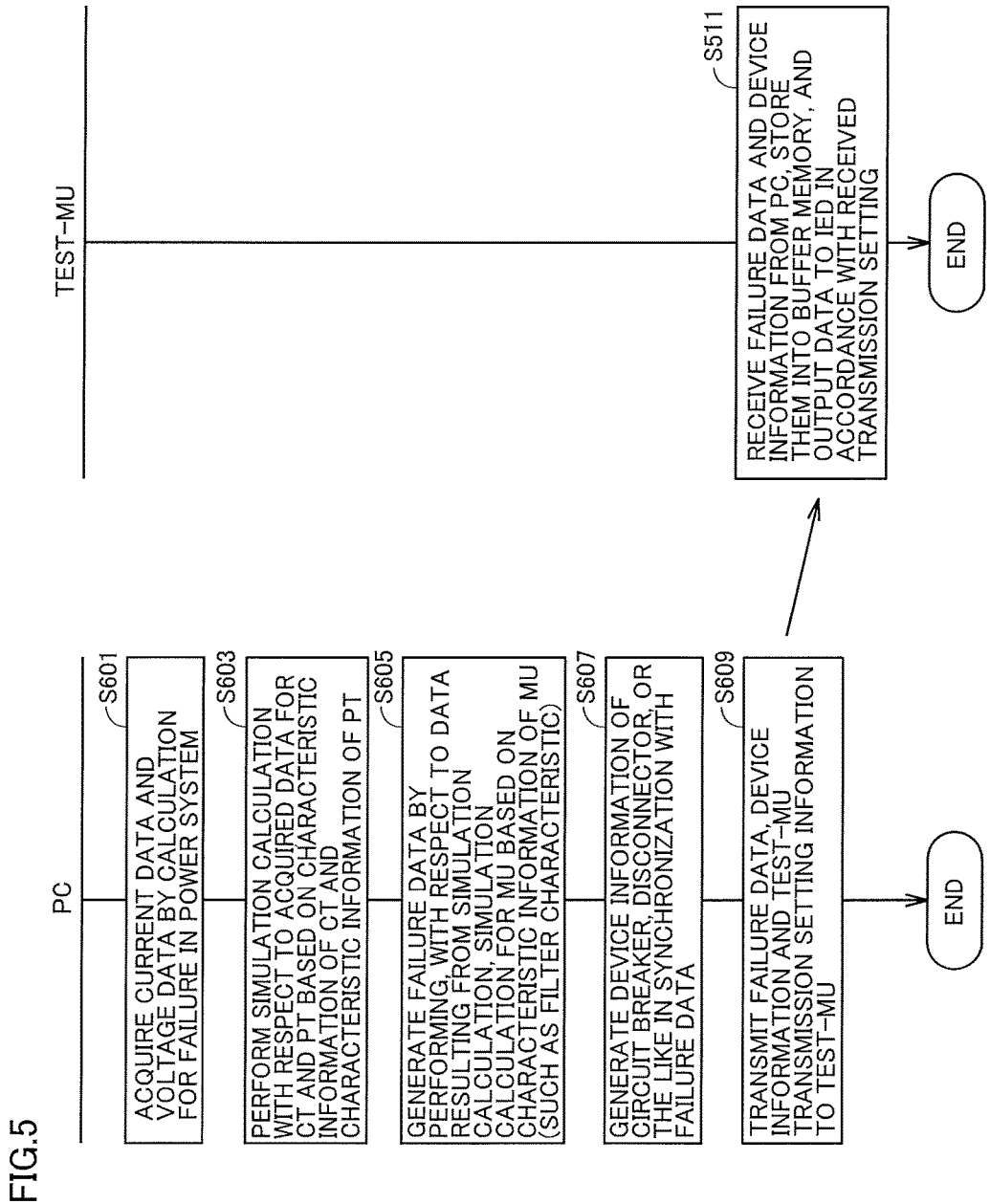
FIG. 5 is a flowchart showing operations of PC 60 and testing device 50.

With reference to FIG. 5, the following describes operations of PC 60 and testing device 50 in the first embodiment.

FIG. 5 is a flowchart showing operations of PC 60 and testing device 50.

In a step S601, in PC 60, failure calculation unit 61 acquires at least one of the current waveform data and voltage waveform data corresponding to the case where the power system is failed.

In a step S603, in PC 60, CT&PT characteristic simulation unit 62 performs simulation calculation according to the characteristics of the CT and the PT based on CT characteristic information 621 and PT characteristic information 622.

In a step S605, in PC 60, MU characteristic simulation unit 63 generates failure data by performing, with respect to the data resulting from the simulation calculation performed in step S603, simulation calculation according to the characteristic of the MU based on MU characteristic information 623.

In a step S607, in PC 60, device information generation unit 65 generates device information (DI) of the circuit breaker or the like in synchronization with the failure data generated in step S605.

In a step S609, in PC 60, data transmission unit 64 transmits the failure data and the device information (DI) to testing device 50, and data transmission unit 64 transmits, to testing device 50, transmission setting information for causing testing device 50 to output the serial data to process bus 22, and then the transmission setting information is held in setting circuit 54.

In a step S511, testing device 50 receives the failure data and the device information (DI) from PC 60, and stores them into data buffer circuit 52. Testing device 50 holds, in output data setting unit 81 and sampling setting unit 82, the transmission setting information received from PC 60, reads the failure data and the device information (DI) from data buffer circuit 52 in accordance with the setting indicated in the transmission setting information, and outputs them to intelligent electronic device 20 via process bus 22 as the serial data.

As a result of outputting the failure data and the device information (DI) to process bus 22 in this way, intelligent electronic device 20 receives the failure data and the device information (DI), and performs protection calculation. Thus, by using testing device 50, in protection control system 1, it is possible to perform (i) the simulation of the power system failure inclusive of the simulation according to the characteristics of the CT and the PT and (ii) the simulation according to the characteristic of the MU to be actually connected to the power system, whereby before connecting the MU and the IED to the power system, an operation characteristic can be checked as to whether a problem or the like occurs due to the connection with the MU and the IED. This ensures highly reliable verification, which also leads to reduction of test cost and test time. Moreover, since the simulation calculation for the MU is performed by PC 60, no current amplifier, voltage amplifier and the like are required.

Second Embodiment

Figure 6:
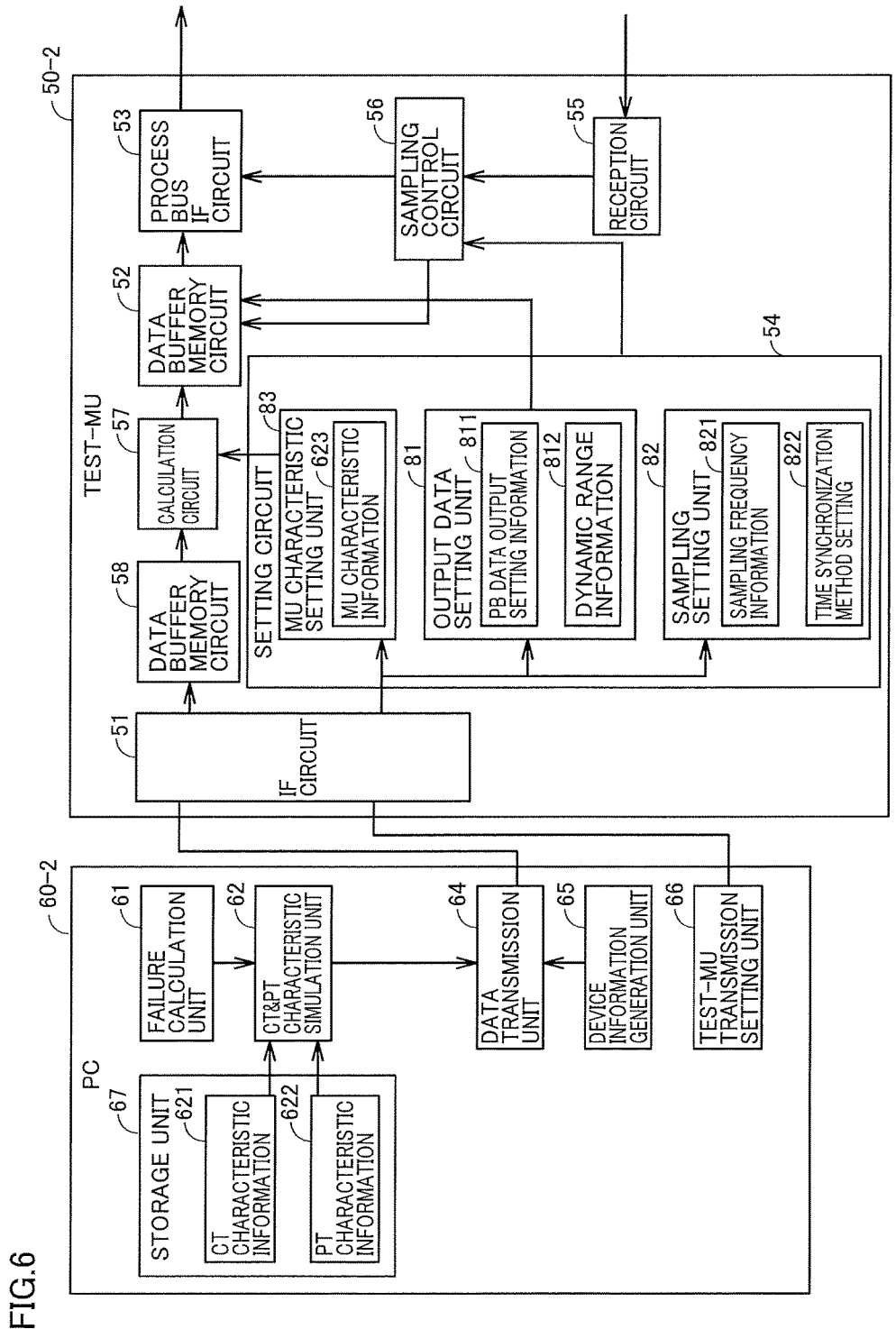
FIG. 6 shows a configuration of a testing device 50-2 and a functional configuration of a PC 60-2 in a second embodiment.
Figure 7:
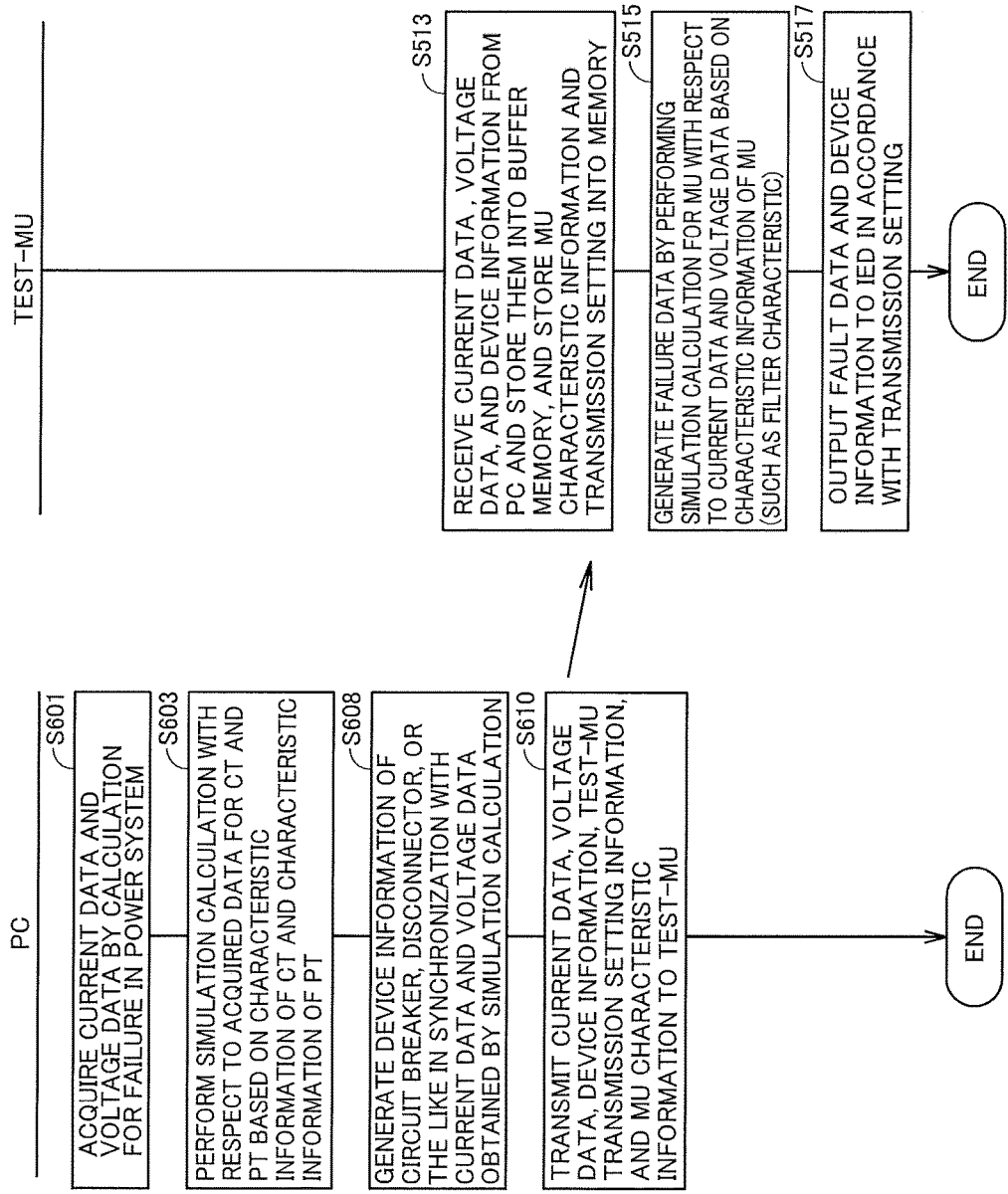
FIG. 7 is a flowchart showing operations of PC 60-2 and testing device 50-2 in the second embodiment.

With reference to FIG. 6 and FIG. 7, the following describes a configuration of a protection control system according to another embodiment. In comparison with the first embodiment, the characteristic of the MU is simulated by testing device 50 in the second embodiment, while the characteristic of the MU is simulated by PC 60 in the first embodiment.

FIG. 6 shows a configuration of a testing device 50-2 and a functional configuration of a PC 60-2 in the second embodiment. In comparison with PC 60 of the first embodiment, data transmission unit 64 in PC 60-2 of the second embodiment transmits, to testing device 50, the current waveform data and voltage waveform data obtained by CT&PT characteristic simulation unit 62 and resulting from the simulation calculation according to the characteristics of the CT and the PT, and then data buffer memory circuit 58 of testing device 50 holds the current waveform data and voltage waveform data therein. TEST-MU transmission setting unit 66, which holds MU characteristic information 623 indicating the characteristic of the MU, transmits MU characteristic information 623 to testing device 50, and then MU characteristic setting unit 83 of setting circuit 54 holds MU characteristic information 623 therein.

In PC 60-2, calculation circuit 57 receives, from MU characteristic setting unit 83 of setting circuit 54, a setting of the simulation calculation according to the characteristic of the MU. Calculation circuit 57 performs simulation calculation with respect to the current waveform data and voltage waveform data held in data buffer memory circuit 58 based on MU characteristic information 623, so as to simulate the characteristic of the MU such as the filter characteristic of the MU. Calculation circuit 57 holds, in data buffer circuit 52, data resulting from the simulation calculation for simulating the characteristic of the MU.

In the second embodiment, with such a configuration, the characteristic of the MU is simulated by testing device 50.

<Operation in Second Embodiment>

FIG. 7 is a flowchart showing operations of PC 60-2 and testing device 50-2 in the second embodiment.

In a step S608, in PC 60, device information generation unit 65 generates the device information (DI) of the circuit breaker or the like in synchronization with the data resulting from the simulation calculation in step S603.

In a step S610, in PC 60, data transmission unit 64 transmits, to testing device 50, (i) the data resulting from the simulation calculation in step S603 and (ii) the device information (DI), so as to hold them in data buffer memory circuit 58; and data transmission unit 64 transmits, to testing device 50, (i) the transmission setting information for causing testing device 50 to output the serial data to process bus 22 and (ii) the MU characteristic information, so as to hold them in setting circuit 54.

In a step S513, from PC 60, testing device 50 receives (i) the data resulting from the simulation calculation in step S603 (the current waveform data and voltage waveform data that simulates the characteristics of the CT and the PT) and (ii) the device information (DI) and stores them into data buffer memory circuit 58, and receives the transmission setting information and the MU characteristic information and stores them into the memory of setting circuit 54.

In a step S515, in testing device 50, calculation circuit 57 generates the failure data by performing the simulation calculation with respect to the current waveform data and voltage waveform data stored in data buffer memory circuit 58 based on the characteristic of the MU so as to simulate the characteristic of the MU, and data buffer circuit 52 holds the generated failure data therein.

In a step S517, testing device 50 outputs, to intelligent electronic device 20 via process bus 22 as the serial data, the failure data and device information (DI) stored in data buffer circuit 52 in accordance with the setting indicated in the transmission setting information.

According to such a configuration, the simulation calculation for the MU according to the characteristic of the MU is performed in testing device 50. Therefore, when the MU is replaced (with an MU manufactured by a different manufacturer, for example), the calculation results of the current waveform data and voltage waveform data calculated by PC 60 can be used without any modification because testing device 50 acquires, from PC 60 or the like, the information (such as MU characteristic information 623) necessary for the simulation of the MU.

Third Embodiment

Figure 8:
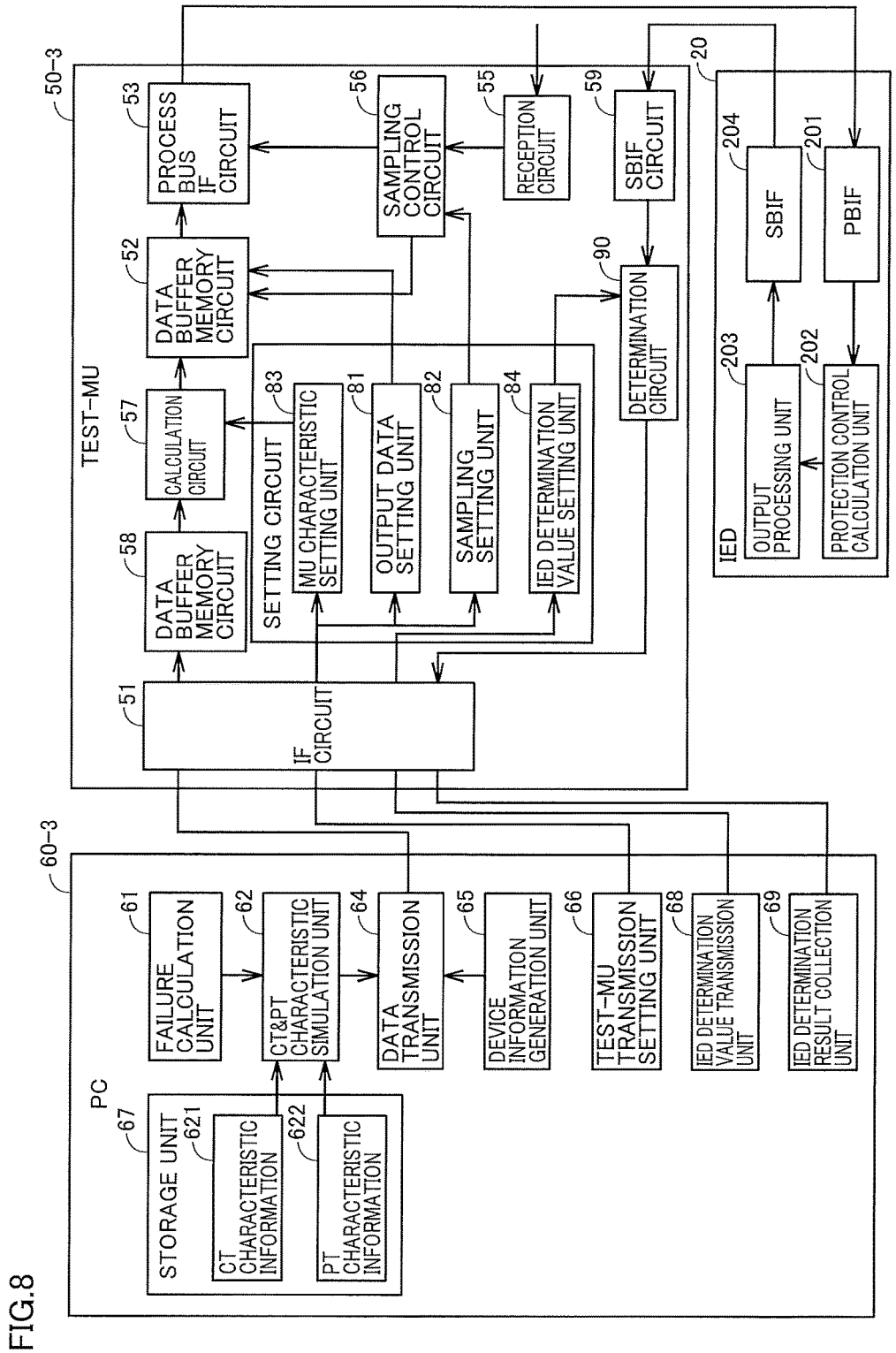
FIG. 8 shows a configuration of a testing device 50-3, a functional configuration of a PC 60-3, and a configuration of an intelligent electronic device 20 in a third embodiment.

With reference to FIG. 8, the following describes a configuration of a protection control system according to another embodiment. In comparison with the protection control systems of the first embodiment and the second embodiment, in the protection control system of the third embodiment, testing device 50 acquires operation information of intelligent electronic device 20 via a station bus 24 and accordingly determines whether or not operation of intelligent electronic device 20 is normal. Thus, the operation of intelligent electronic device 20 can be checked automatically, thereby resulting in efficient operation check.

FIG. 8 shows a configuration of a testing device 50-3, a functional configuration of a PC 60-3, and a configuration of intelligent electronic device 20 in the third embodiment.

Intelligent electronic device 20 includes a PBIF (process bus IF) 201, a protection control calculation unit 202, an output processing unit 203, and an SBIF (station bus IF) 204. PBIF 201 is an interface configured to receive, via process bus 22, the data output to process bus 22 by testing device 50. Protection control calculation unit 202 performs protection calculation based on the failure data or the like received by PBIF 201, and outputs the result of protection calculation to output processing unit 203. Output processing unit 203 generates output data for outputting, to testing device 50 via station bus 24, the result of the protection calculation performed by protection control calculation unit 202, in accordance with a protocol defined in the station bus. SBIF 204 outputs the output data to station bus 24.

PC 60 includes an IED determination value transmission unit 68 and an IED determination result collection unit 69. IED determination value transmission unit 68 transmits, to testing device 50, a determination value to be compared with the result of the protection calculation performed by intelligent electronic device 20. IED determination result collection unit 69 receives and collects, from testing device 50, a result of comparison between the determination value and the result of the protection calculation performed by intelligent electronic device 20.

Testing device 50 includes an SBIF circuit 59, an IED determination value setting unit 84, and a determination circuit 90. IED determination value setting unit 84 receives and holds the determination value transmitted by IED determination value transmission unit 68 of PC 60, and sets the determination value at determination circuit 90. SBIF circuit 59 receives data via station bus 24. Determination circuit 90 compares (i) the result of the protection calculation of intelligent electronic device 20 received by SBIF circuit 59 with (ii) the determination value set by IED determination value setting unit 84. When the result of protection calculation and the determination value fall within a certain range, determination circuit 90 determines that the calculated result of intelligent electronic device 20 is normal. Otherwise, determination circuit 90 determines that the calculated result of intelligent electronic device 20 is not normal and transmits the determination result to PC 60 via IF circuit 51.

It should be noted that in the example of FIG. 8, the explanation has been made based on the configurations of the testing device and the PC in the second embodiment; however, the operation of intelligent electronic device 20 can be automatically checked by the testing device in a similar manner also in the configurations of the testing device and PC in the first embodiment.

Moreover, in the third embodiment, the determination result provided by testing device 50-3 is collected by PC 60-3, but may be collected by testing device 50-3.

Fourth Embodiment

Figure 9:
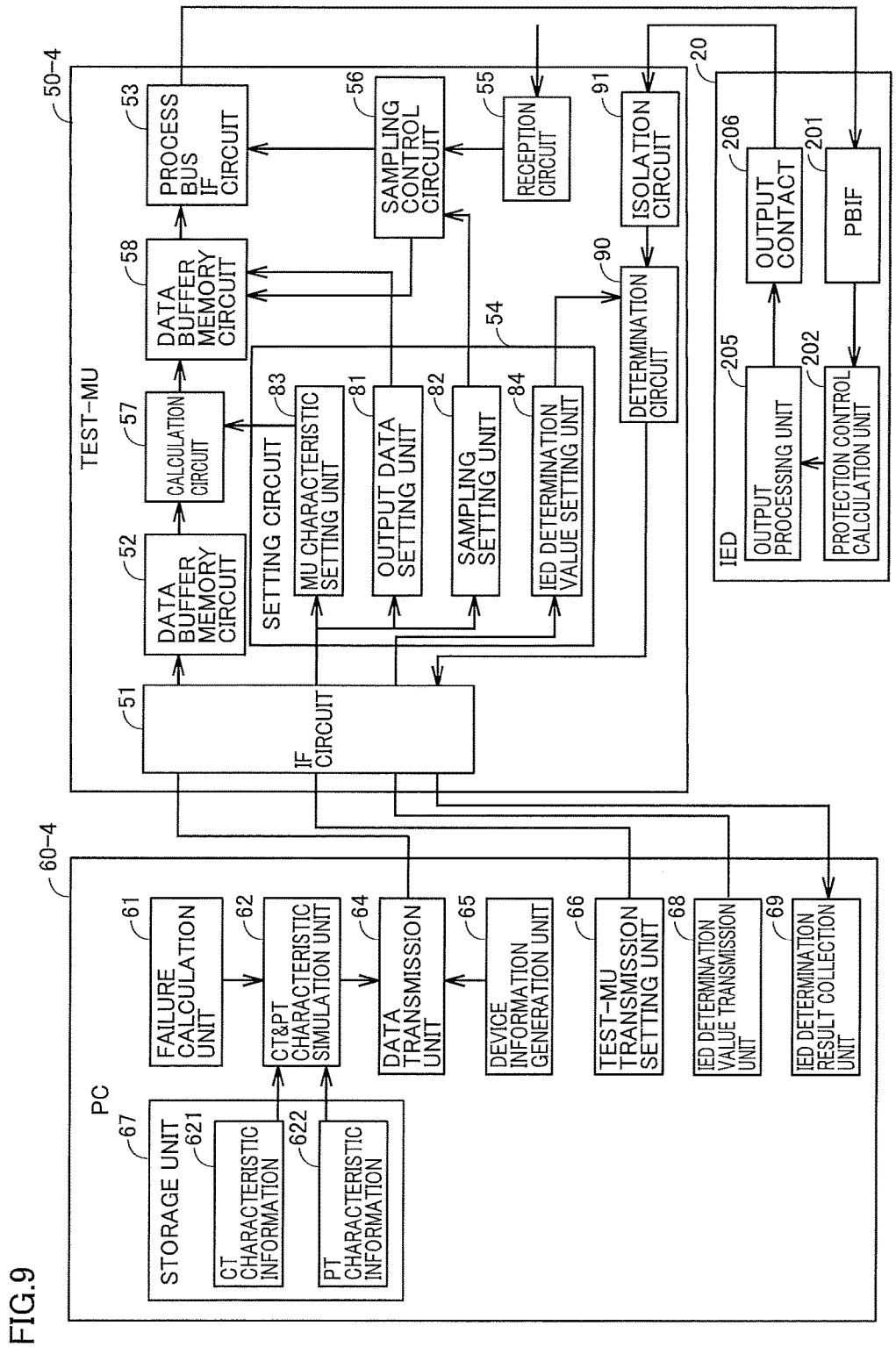
FIG. 9 shows a configuration of a testing device 50-4, a functional configuration of a PC 60-4, and a configuration of intelligent electronic device 20 in a fourth embodiment.

With reference to FIG. 9, the following describes a configuration of a protection control system according to another embodiment. FIG. 9 shows a configuration of a testing device 50-4, a functional configuration of a PC 60-4, and a configuration of intelligent electronic device 20 in the fourth embodiment.

In comparison with the protection control system of the third embodiment, in order to determine whether or not operation of intelligent electronic device 20 is normal, the testing device in the protection control system of the third embodiment is configured to acquire, via station bus 24, the result of the protection calculation performed by intelligent electronic device 20. On the other hand, in the fourth embodiment, intelligent electronic device 20 is connected to testing device 50-4 via a wire, and the result of the protection calculation is output from intelligent electronic device 20 to testing device 50-4 as a contact signal of the output circuit of intelligent electronic device 20. In testing device 50-4, isolation circuit 91 acquires the result of the protection calculation performed by intelligent electronic device 20, converts it into a signal that can be processed therein, and outputs the converted signal to determination circuit 90. In testing device 50-4, determination circuit 90 determines whether or not operation of intelligent electronic device 20 is normal.

Thus far, the protection control systems according to the embodiments have been described; however, also in a failure waveform recording device or the like, the simulation calculations may be performed in accordance with the characteristic of the CT, the characteristic of the PT, and the characteristic of the MU by utilizing PC 60 or the like.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: protection control system; 2: power transmission line; 6: circuit breaker; 7: current transformer; 8: potential transformer; 10: merging unit; 11: isolation transformer; 12: analog filter; 13: AD conversion circuit; 14: data buffer memory circuit; 15: process bus IF circuit; 16: reception circuit; 17: sampling control circuit; 18: data reading circuit; 19: isolation circuit; 20: intelligent electronic device; 22: process bus; 24: station bus; 26: substation automation system device; 28: remote monitoring control device; 30: remote control center; 50: testing device; 51: IF circuit; 52: data buffer circuit; 53: process bus IF circuit; 54: setting circuit; 55: reception circuit; 56: sampling control circuit; 57: calculation circuit; 58: data buffer memory circuit; 60: PC; 61: failure calculation unit; 62: CT&PT characteristic simulation unit; 63: MU characteristic simulation unit; 64: data transmission unit; 65: device information generation unit; 66: TEST-MU transmission setting unit; 67: storage unit; 68: IED determination value transmission unit; 69: IED determination result collection unit; 81: output data setting unit; 82: sampling setting unit; 83: MU characteristic setting unit; 84: IED determination value setting unit; 90: determination circuit; 91: isolation circuit.

The invention claimed is:

1. A testing device for testing an intelligent electronic device of a power system, the testing device comprising:
a first acquisition unit configured to acquire failure data resulting from simulation calculation for a CT (Current Transformer) and a PT (Potential Transformer) and simulation calculation for an MU (Merging Unit), the simulation calculation for the CT and the PT being performed with respect to current waveform data and voltage waveform data in the power system based on first characteristic information indicating a characteristic of an instrument transformer, the simulation calculation for the MU being performed with respect to the current waveform data and voltage waveform data in the power system based on second characteristic information indicating a characteristic of the MU;
a second acquisition unit configured to acquire device information data in synchronization with the failure data, the device information data indicating a circuit breaker of the power system;
a storage unit configured to store first setting information and second setting information, the first setting information indicating a setting about current and voltage for outputting data to a process bus, the second setting information indicating a setting of sampling; and
an output unit configured to transmit the acquired failure data and device information data to the intelligent electronic device via the process bus in accordance with the first setting information and the second setting information for operation of the circuit breaker of the power system.

2. The testing device according to claim 1, wherein the testing device is connected to an information processing device, and
the acquisition of the failure data by the first acquisition unit includes acquiring the failure data resulting from the simulation calculations by the testing device by (i) performing the simulation calculation for the CT and the PT and the simulation calculation for the MU by the information processing device and (ii) transmitting the failure data to the testing device by the information processing device.

3. The testing device according to claim 1, wherein the testing device is connected to an information processing device,
the storage unit is configured to store the second characteristic information indicating the characteristic of the MU, and
the acquisition of the failure data by the first acquisition unit includes acquiring the failure data by (i) performing the simulation calculation for the CT and the PT by the information processing device, (ii) acquiring, from the information processing device by the testing device, data resulting from the simulation calculation for the CT and the PT, and (iii) performing the simulation calculation for the MU with respect to the acquired data based on the second characteristic information.

4. The testing device according to claim 3, wherein the testing device is configured to receive the second characteristic information from the information processing device, and store the received second characteristic information into the storage unit.

5. The testing device according to claim 1, wherein the testing device is connected to an information processing device,
the testing device is configured to receive the second setting information from the information processing device, and store the received second setting information into the storage unit,
the testing device is configured to receive a synchronization signal from outside, and
the output unit is configured to transmit the failure data and the device information data to the intelligent electronic device in accordance with the second setting information and a timing that is based on the synchronization signal.

6. The testing device according to claim 1, wherein the testing device is connected to an information processing device,
the testing device is configured to receive the first setting information from the information processing device, and store the received first setting information into the storage unit, and
the output unit is configured to transmit the failure data and the device information data to the intelligent electronic device in accordance with the first setting information.

7. The testing device according to claim 1, comprising:
a third acquisition unit configured to acquire a determination value for determining whether or not protection calculation of the intelligent electronic device is normal;
a reception unit configured to receive, from the intelligent electronic device, a result of the protection calculation for the failure data; and
a determination unit configured to determine whether or not the intelligent electronic device is normal, by comparing (i) the received result of the protection calculation for the failure data with (ii) the acquired determination value.

8. The testing device according to claim 7, wherein
the testing device is connected to a station bus, and
the reception unit is configured to receive the result of the protection calculation for the failure data from the intelligent electronic device via the station bus.

9. The testing device according to claim 7, wherein
the testing device is connected to the intelligent electronic device via a wire, and
the reception unit includes an isolation circuit, and is configured to acquire the determination value from the intelligent electronic device via the isolation circuit.

10. The testing device according to claim 2, comprising:
a third acquisition unit configured to acquire a determination value for determining whether or not protection calculation of the intelligent electronic device is normal;
a reception unit configured to receive, from the intelligent electronic device, a result of the protection calculation for the failure data;
a determination unit configured to determine whether or not the intelligent electronic device is normal, by comparing (i) the received result of the protection calculation for the failure data with (ii) the acquired determination value; and
a determination result output unit configured to output a result of the determination made by the determination unit to the information processing device.

11. A testing method for a testing device to test an intelligent electronic device of a power system, the testing device including a storage unit configured to store first setting information and second setting information, the first setting information indicating a setting about current and voltage for outputting data to a process bus, the second setting information indicating a setting of sampling,
the testing method comprising the steps of:
acquiring, by the testing device, failure data resulting from simulation calculation for a CT (Current Transformer) and a PT (Potential Transformer) and simulation calculation for an MU (Merging Unit), the simulation calculation for the CT and the PT being performed with respect to current waveform data and voltage waveform data in the power system based on first characteristic information indicating a characteristic of an instrument transformer, the simulation calculation for the MU being performed with respect to the current waveform data and voltage waveform data in the power system based on second characteristic information indicating a characteristic of the MU;
acquiring, by the testing device, device information data in synchronization with the failure data, the device information data indicating a circuit breaker of the power system; and
transmitting, by the testing device, the acquired failure data and device information data to the intelligent electronic device via the process bus in accordance with the first setting information and the second setting information for operation of the circuit breaker of the power system.

12. A non-transitory computer-readable storage medium storing a program for controlling operation of an information processing device connected to a testing device for testing an intelligent electronic device of a power system, the information processing device including a processor and a memory, the memory being configured to store first characteristic information, second characteristic information, and device information data, the first characteristic information indicating a characteristic of an instrument transformer, the second characteristic information indicating a characteristic of an MU (Merging Unit), the device information data indicating a circuit breaker of the power system,
the program causing the processor to perform the steps of:
performing simulation calculation for a CT (Current Transformer) and a PT (Potential Transformer) with respect to current waveform data and voltage waveform data of the power system based on the first characteristic information;
generating failure data by performing simulation calculation for the MU with respect to data resulting from the simulation calculation for the CT and the PT, based on the second characteristic information; and
transmitting the failure data and the device information data to the testing device for operation of the circuit breaker of the power system.

* * * * *